United States Patent [19]

Priel et al.

[11] Patent Number: 4,519,076
[45] Date of Patent: May 21, 1985

[54] MEMORY CORE TESTING SYSTEM

[75] Inventors: Ury Priel; Giora Yaron, both of Cupertino; Mark S. Ebel, Santa Clara, all of Calif.

[73] Assignee: National Semiconductor Corporation, Santa Clara, Calif.

[21] Appl. No.: 334,699

[22] Filed: Dec. 28, 1981

[51] Int. Cl.³ .............................................. G06F 11/22
[52] U.S. Cl. ..................................... 371/21; 371/20; 365/201; 324/73 AT
[58] Field of Search ...................... 371/20, 21, 25, 28; 365/201; 324/73 R, 73 AT, 73 PC

[56] References Cited

U.S. PATENT DOCUMENTS

| | | | |
|---|---|---|---|
| 3,712,537 | 1/1973 | Carita | 365/201 |
| 3,795,859 | 3/1974 | Benante et al. | 371/28 |
| 3,813,032 | 5/1974 | King | 371/21 |
| 3,820,077 | 6/1974 | Giebler et al. | 371/28 |
| 4,066,880 | 1/1978 | Sailey | 371/21 |
| 4,243,937 | 1/1981 | Multani et al. | 371/21 |
| 4,272,833 | 6/1981 | Taylor | 365/201 |
| 4,298,980 | 11/1981 | Hajdu et al. | 371/21 |
| 4,326,290 | 4/1982 | Davis et al. | 371/21 |
| 4,393,475 | 7/1983 | Kitagawa et al. | 365/201 |

FOREIGN PATENT DOCUMENTS

WO81/00154  1/1981  PCT Int'l Appl. .

OTHER PUBLICATIONS

Das Gupta, *IBM Technical Disclosure Bulletin*, "Memory Array Having Independent Data Reading and Data Checking", vol. 15, No. 1, Jun. 1972, pp. 39-40.
Moyers et al., "Electrical Characterization of Complex Memories", Final Technical Report, RADC-TR-80-401, Part 2, Rome Air Development Center, Griffis AFB, NY, Jan. 1981.

*Primary Examiner*—Jerry Smith
*Assistant Examiner*—Gary V. Harkcom
*Attorney, Agent, or Firm*—Michael J. Pollock; Paul J. Winters; Gail W. Woodward

[57] ABSTRACT

A means for testing the threshold voltage changes in a programmable and erasable floating gate memory cell by accessing directly and exclusively the cells in the core, and the amplifiers that sense the operation of the cells, so as to measure the relative currents therein as an indication of threshold voltage parameters.

7 Claims, 1 Drawing Figure

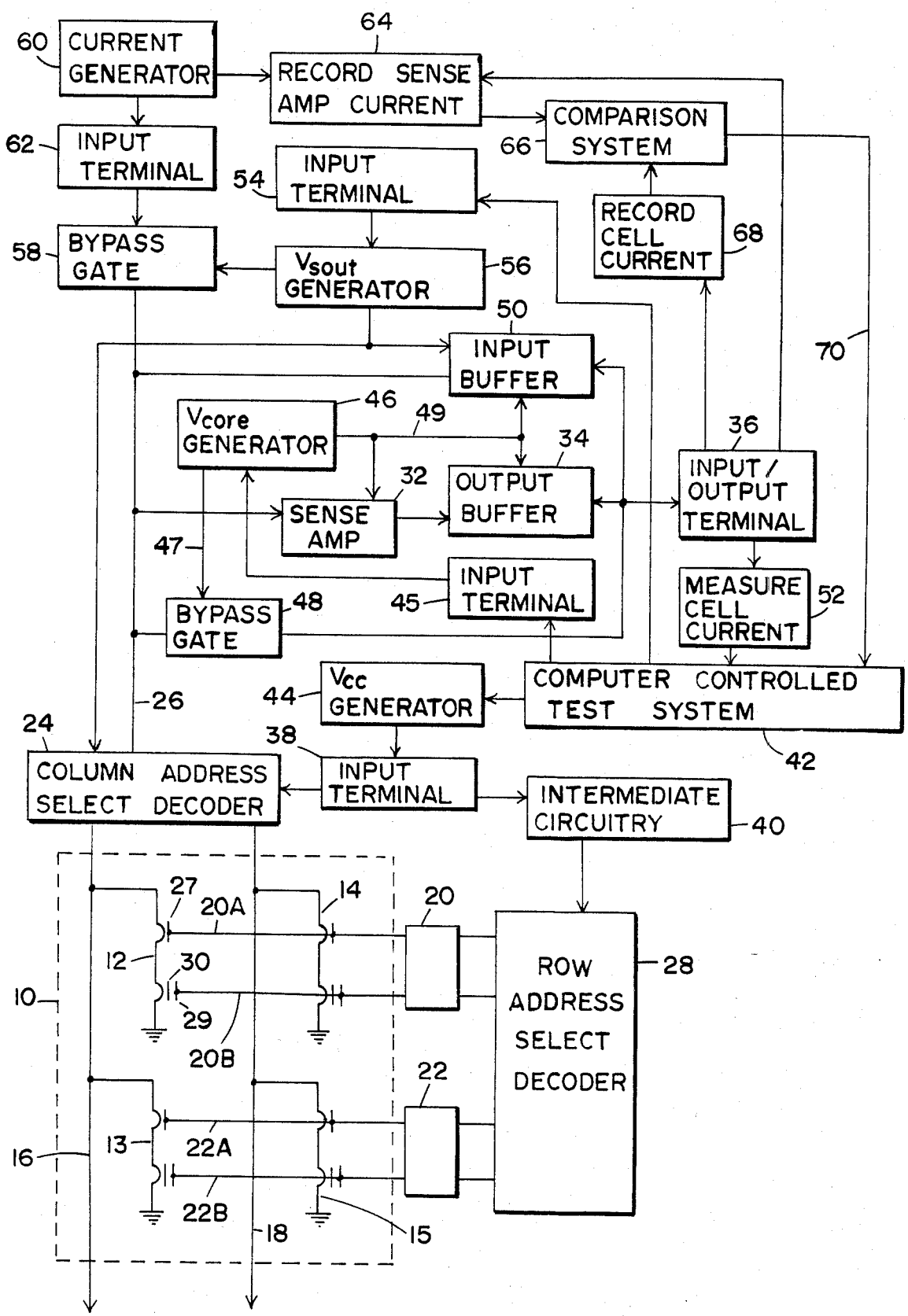

MEMORY CORE TESTING SYSTEM

BACKGROUND OF THE INVENTION

This invention applies to the field of non-volatile electrically alterable read only memories of the type constructed on high density semiconductor chips. For the purpose of explanation, the disclosure is directed to one subclass of these semiconductor memories which utilize an array of storage cells constructed from field effect transistors with floating gates. In this type of storage cell, source and drain regions, separated by a channel, are formed in a substrate. The floating gate overlays the channel and a control gate overlays the floating gate. The memory storage cell is read by applying a voltage to the control gate and sensing any resulting current flow in the channel. Current may or may not flow in the channel depending on whether charge has been stored on the floating gate during programming.

Various means are used to program or store charge on the floating gate. This charge may leak off with time under stressing conditions, or if fabrication defects exist. Also after many program and erase cycles, charge carriers can become trapped in the insulating oxide between the floating gate and the channel, thus, modifying the threshold voltage of the device. Similar problems exist with other kinds of electrically alterable storage cells as well.

The prior art recognizes the need to measure the change in threshold voltage in order to foresee changes beyond acceptable limits. This foreknowledge allows one to substitute new parts before the old parts fail, and provide erroneous readout data. Typically, this has been done by addressing a particular cell in the memory and altering the gate voltage to that cell by varying the supply voltage of the entire memory. Such an approach is described in the Final Technical Report RADC-TR-80-401, Part 2 of January 1981, issued by Rome Air Development Center and titled Electrical Characterization of Complex Memories.

Numerous problems derive from this approach. For one, the supply voltage is not coupled directly to the control gates, but is routed through intermediate circuits that may affect the resultant control gate voltage. Hence, it is not possible to know exactly what the gate voltage is when the cell turns on or off. Another problem arises in that the cell operation is actually detected by a sensing amplifier which operates off the same supply voltage that is being varied during the test. Thus, the operating characteristics of the sensing amplifier may shift, giving inconsistent measurements of when the cell turns on and off. This, in effect, masks the true variation in cell threshold. Accordingly, prior art techniques have provided only a rough approximation of the actual threshold voltage of the tested cell. The present invention, however, provides means to determine the threshold voltage much more precisely.

SUMMARY OF THE INVENTION

Briefly, the instant invention sidesteps the problems associated with not being able to know the exact voltage applied to the gate of the cell by holding gate voltage constant and measuring instead, the magnitude of the current flowing through the channel. Since the current magnitude is a known mathematical function of the threshold voltage, the current will change in a predictable way with changing threshold voltage. By examining the stress induced reduction of current over time, one can extrapolate the reduction in threshold voltage and predict an unacceptable threshold voltage.

An additional embodiment of the invention may be used to determine even more precisely when a new part is needed. One of the criteria for deciding if a threshold voltage is too low is whether or not one can detect the cell current, even though the cell may not be producing as much current as normal. This capability depends on the ability of a sensing amplifier to respond to the current flow through the cell. By accessing the sensing amplifiers directly and supplying a known test current thereto, the instant invention establishes exactly the minimum current needed to operate the sense amplifiers. This current level may then be compared to the actual current produced by the cells in the memory core as a direct indication of the remaining margin of safety. With this technique, all doubts about the performance of the peripheral circuits may be ignored and a high confidence indication of cell threshold can still be obtained.

BRIEF DESCRIPTION OF THE DRAWING

The drawing shows a schematic diagram of the new circuit in a form that incorporates both embodiments discussed above.

DESCRIPTION OF THE PREFERRED EMBODIMENT

In the drawing, a small portion of a typical memory array is schematically shown inside dashed line 10, comprising four memory cells 12, 13, 14 and 15. These cells may be selected individually, or addressed, by applying voltages to the correct row and column line that intersect at the desired cell. In the drawing, two column lines 16 and 18 are depicted. Likewise, two row lines 20 and 22 are shown, each comprising a pair of conductors labeled A and B. To address cell 12, for example, a column address select decoder 24 activates line 16 so as to connect an input-output line 26 to line 16. A row address select decoder 28 applies suitable voltages to lines 20A and 20B and thus, to control gates 27 and 29 so as to turn on the two series connected transistors in cell 12. The floating gate transistor may or may not conduct, depending upon the presence of a charge on a floating gate 30. If it does turn on, the current therethrough also flows through input/output line 26 where it is sensed by a sensing amplifier 32 which in turn signals the presence of current flow through a suitable output buffer 34 to an input/output terminal 36.

Various factors can affect the ability of floating gate 30 to modify the operation of control gate 29. Thus, it is desirable to be able to check its operation. In the prior art, this testing involves introducing a controlled supply voltage $V_{CC}$ to an input terminal 38. This voltage reaches gate 29 through some intermediate circuitry 40 and decoder 28. The intermediate circuitry 40 may change the voltage a bit so it is not possible to know with certainty the exact voltage applied to gate 29. As supply voltage $V_{CC}$ is carefully varied, cell 12 turns on and off when the threshold voltage is crossed. If one assumes that the voltage on gate 29 is roughly equal to $V_{CC}$, the threshold voltage can be inferred, albeit only roughly. The present invention provides a more accurate measurement.

In one embodiment, an operator or a computer controlled test system 42 operates a supply voltage generator 44 so as to supply a fixed predetermined voltage to input terminal 38 and thence to gate 29. Although th exact magnitude of the voltages on cell 12 cannot be known, it is important for the purposes of this invention only that the voltages be the same from test to test. Since the effect of circuits 24, 40, and 28 is the same from test to test, if $V_{CC}$ is always the same, the voltages on cell 12 will always be the same. Test system 42 also activates a $V_{CORE}$ generator 46 via an input terminal 45. Generator 46 generates signals allowing direct access to the memory core and a bypassing of all circuits that could alter the magnitude of the current from the core. Generator 46 does this by producing an enable signal on line 47 so as to operate a bypass gate 48 and connect terminal 36 directly to the input/output line 26. At the same time, a disable signal from generator 46, on line 49, operates to disable sense amplifier 32, output buffer 34, and any other parallel circuits that could mask the true current flow, such as input buffer 50. Since only current from the selected cell is present at terminal 36, it can be measured by any suitable measuring means 52 and evaluated at several different points in time by tester 42. The threshold voltage may then be calculated by means of mathematical relationships well known to those skilled in the art.

Since the desire to observe the degradation of the threshold voltage arises mainly from a need to predict cell failure, it is also advantageous to define exactly what constitutes failure. Even a cell working at less than normal parameters may be acceptable, provided sensing amplifier 32 can properly detect the current flow from the cell. This, in turn, is a function of the threshold current necessary to operate sensing amplifier 32. An additional feature of this invention allows this threshold current to also be measured.

A suitable signal is presented to a $V_{SOUT}$ generator 56 through an input terminal 54 from testing equipment which may comprise, for example, test system 42. This causes generator 56 to generate signals allowing direct and exclusive access to the sensing amplifier 32 so as to permit the application of a test current thereto. Generator 56 does this by producing an enable signal that operates a bypass gate 58. At the same time, a disable signal from generator 56 disables input buffer 50, column address select decoder 24, and any other circuit that could affect the current flow to amplifier 32. With amplifier 32 isolated, a current generator 60 may be used to provide a test current through terminal 62 and gate 58 to amplifier 32. When amplifier 32 activates, the resulting signal at terminal 36 is directed to a recording means 64 which then records the current level from generator 60 needed to activate amplifier 32. This current may then be compared by a comparison system 66 with the core current, the magnitude of which is measured and recorded by cell current recording means 68. If desired, the information can be automatically returned to test system 42 on line 70.

It is clear to those skilled in the art that the precise testing equipment used in conjunction with the invention is not important, and thus, many variations to the arrangements schematically outlined in the drawing will occur to those ordinarily skilled in the art. The main objective of this invention is to afford a method and means to create exclusive circuits to the cells of the core and the sensing amplifiers therefor, so as to measure relative currents therethrough and hence we intend to be limited only by the following claims.

What is claimed is:

1. Apparatus to gain direct access to current carrying portions of a non-volatile electrically alterable read only memory to permit testing of the memory core to determine the current flow of said current carrying portions, said apparatus comprising:
   an electrical connection terminal on the memory;
   an addressable memory core on the memory;
   current conditioning buffer means connected between said terminal and said memory core so as to permit efficient electrical communication with said memory core;
   a first bypass gate connected between said terminal and said memory core;
   first bypass signal generating means operable in response to the application of a predetermined first access signal to disable said current conditioning buffer means and enable first bypass gate so as to permit current flow directly from said memory core to the terminal;
   a computer controlled test system external to said memory and connected to said terminal and said first generating means, said test system operable to provide said predetermined first access signal to said first generating means and further operable to measure the current flow from said memory core, through said first bypass gate and said terminal.

2. The apparatus of claim 1 in which said buffer means includes a sensing amplifier and output buffer connected in series between said terminal and said memory core and also includes an input buffer.

3. The apparatus of claim 1 including a second bypass gate connected to the connection point between the memory core and the buffer means and also including a second bypass signal generating means operable in response to the application of a second access signal to enable said second bypass gate.

4. The apparatus of claim 3 in which said buffer means includes a sensing amplifier and an output buffer connected in series between said terminal and said memory core and also includes an input buffer connected in parallel with said output buffer and sense amplifier.

5. The apparatus of claim 4 in which said second bypass signal generating means is also operable, in response to said second access signal, to disable said input buffer and said memory core.

6. The apparatus of claim 5 including current generating means and recording means connected to the second bypass gate to record the threshold current needed to activate the sensing amplifier, current recording means connected to the terminal to record the current flow in the memory core, and comparing means connected to the recording means to compare the core generated current with the sensing amplifier threshold current.

7. The apparatus of claim 6 in combination with a computer controlled test system external to said memory and connected to said terminal and said first generating means, said test system operable to provide a predetermined first access signal to said first generating means and further operable to measure the current flow from said core through said first bypass gate and said terminal.

* * * * *